(12) United States Patent
Konkola et al.

(10) Patent No.: US 12,266,509 B2
(45) Date of Patent: Apr. 1, 2025

(54) MULTILAYER COATINGS OF COMPONENT PARTS FOR A WORK PIECE PROCESSING CHAMBER

(71) Applicant: LAM RESEARCH CORPORATION, Fremont, CA (US)

(72) Inventors: Paul Konkola, West Linn, OR (US); Ramesh Chandrasekharan, Portland, OR (US); Andrew H. Breninger, Hillsboro, OR (US); Tony Shaleen Kaushal, Campbell, CA (US)

(73) Assignee: LAM RESEARH CORPORATION, Fremont, CA (US)

( * ) Notice: Subject to any disclaimer, the term of this patent is extended or adjusted under 35 U.S.C. 154(b) by 332 days.

(21) Appl. No.: 17/311,639

(22) PCT Filed: Nov. 13, 2019

(86) PCT No.: PCT/US2019/061233
§ 371 (c)(1),
(2) Date: Jun. 7, 2021

(87) PCT Pub. No.: WO2020/123082
PCT Pub. Date: Jun. 18, 2020

(65) Prior Publication Data
US 2022/0028662 A1    Jan. 27, 2022

Related U.S. Application Data
(60) Provisional application No. 62/779,113, filed on Dec. 13, 2018.

(51) Int. Cl.
*C23C 16/02* (2006.01)
*C23C 16/40* (2006.01)
(Continued)

(52) U.S. Cl.
CPC .... *H01J 37/32495* (2013.01); *C23C 16/0281* (2013.01); *C23C 16/403* (2013.01);
(Continued)

(58) Field of Classification Search
None
See application file for complete search history.

(56) References Cited

U.S. PATENT DOCUMENTS

| | | | |
|---|---|---|---|
| 10,233,554 B2 | 3/2019 | Pareek et al. | |
| 2006/0110620 A1* | 5/2006 | Lin | C23C 28/021 428/650 |

(Continued)

FOREIGN PATENT DOCUMENTS

| | | |
|---|---|---|
| CN | 101647098 A | 2/2010 |
| KR | 2018-0023500 | 3/2018 |

(Continued)

OTHER PUBLICATIONS

Bara et al., "Influence of Anodizing Parameters on Surface Morphology and Surface-Free Energy of Al2O3 Layers Produced on EN AW-5251 Alloy", Feb. 27, 2019, Materials, 12, 695. (Year: 2019).*

(Continued)

*Primary Examiner* — Xiaobei Wang
(74) *Attorney, Agent, or Firm* — Alleman Hall & Tuttle LLP

(57) ABSTRACT

A processing tool, comprising a processing chamber for processing a work piece, the processing chamber including at least one component part that is coated with multi-layer protective coating including (a) an aluminum layer formed on the at least one component part and (b) a ceramic coating formed on the aluminum layer. In various embodiments, the multi-layer protective coating can be applied to at least one component part prior to assembly of the processing chamber or at least partially in situ the processing chamber.

20 Claims, 7 Drawing Sheets

(51) Int. Cl.
  *C23C 16/44* (2006.01)
  *C23C 16/455* (2006.01)
  *C23C 28/00* (2006.01)
  *C25D 3/44* (2006.01)
  *H01J 37/32* (2006.01)

(52) U.S. Cl.
  CPC .... *C23C 16/4404* (2013.01); *C23C 16/45544* (2013.01); *C23C 28/32* (2013.01); *C23C 28/345* (2013.01); *C25D 3/44* (2013.01); *H01J 37/32477* (2013.01); *Y10T 428/12667* (2015.01); *Y10T 428/12736* (2015.01)

(56) References Cited

U.S. PATENT DOCUMENTS

| | | | | |
|---|---|---|---|---|
| 2008/0223725 | A1* | 9/2008 | Han | C25D 5/50 |
| | | | | 156/391 |
| 2009/0114153 | A1* | 5/2009 | Kurita | C23C 16/45517 |
| | | | | 220/378 |
| 2009/0194233 | A1* | 8/2009 | Tamura | C23C 16/403 |
| | | | | 427/454 |
| 2011/0117728 | A1 | 5/2011 | Su et al. | |
| 2013/0143037 | A1* | 6/2013 | Suhonen | C23C 4/129 |
| | | | | 106/286.2 |
| 2014/0174362 | A1* | 6/2014 | Kao | C23C 16/45565 |
| | | | | 118/723 R |
| 2014/0295670 | A1 | 10/2014 | Shih et al. | |
| 2017/0260639 | A1* | 9/2017 | Pareek | C25D 11/04 |
| 2018/0240648 | A1* | 8/2018 | Wu | C23C 16/045 |
| 2019/0096712 | A1* | 3/2019 | Park | H01L 21/302 |

FOREIGN PATENT DOCUMENTS

| | | |
|---|---|---|
| KR | 2018-0116446 | 10/2018 |
| TW | 201840892 A | 11/2018 |

OTHER PUBLICATIONS

International Search Report from International Application No. PCT/US2019/061233 dated Mar. 11, 2020.
Written Opinion from International Application No. PCT/US2019/061233 dated Mar. 11, 2020.
Taiwan Intellectual Property Office, Office Action and Search Report Issued in Application No. 108144850, Aug. 15, 2023, 10 pages.

* cited by examiner

MULTILAYER COATINGS OF COMPONENT PARTS FOR A WORK PIECE PROCESSING CHAMBER

CROSS REFERENCE TO RELATED APPLICATION

This application claims the benefit of priority of U.S. Application No. 62/779,113, filed Dec. 13, 2018, which is incorporated herein by reference for all purposes.

BACKGROUND

The present invention relates to work piece processing tools, and more particularly, to protective multilayer coatings applied to component parts of such tools to protect against damage caused by thermal cycling, corrosion, and potential failure caused by exposure to various chemistries used in processing chambers.

Work pieces, such as semiconductor wafers and flat panel displays, are typically processed by various processing tools during fabrication. For instance, various types of deposition tools are commonly used for depositing various thin films onto work piece surfaces. Similarly, various etching tools, such as wet and/or plasma etching tools, are also commonly used for the selective removal of layers of material from surfaces of work pieces. A wide variety of different chemistries are used within processing chambers.

With plasma etching tools, for example, a work piece is typically exposed to a chlorine and/or flourine rich plasma. The plasma is created within the processing chamber during depositions when a radio Frequency (RF) is applied to one or more reactant gasses, such as silane ($SiH_4$), nitrous oxide ($N_2O$), ammonia ($NH_4$), nitrogen ($N_2$), etc. Also, with deposition tools, the material deposited on work pieces typically also accumulates on surfaces exposed within the processing chamber as well. During a routine "dry cleaning" procedure, a chlorine and/or flourine rich plasma may be periodically generated within the processing chamber to remove these deposits. Similarly, with etching tools, chlorine and/or flourine are commonly used for the removal of select material from work pieces.

Processing chambers of both etching and deposition tools are constructed from a wide assortment of sub-assemblies (e.g., shower head, a work piece heater, portions of the work piece holder, etc.) and a variety of mechanical parts, such as clamps, screws, bolts, springs, pins, clips and other mechanical fasteners that are used for mechanically holding the various sub-assemblies together. Collectively, these sub-assemblies and/or mechanical parts, hereafter referred to generically as "component parts", are characterized as (1) any metal part that is exposed to chemistries within the processing chamber and/or (2) is subject to some type of mechanical stress, such as flexing caused by thermal cycling, rubbing and/or contact with or rubbing against another component part, such as the case with clamps, springs, pins and clips for instance.

When these component parts are exposed to the various chemistries used in processing chambers, they tend to experience corrosion, which is problematic. With certain types of components, such as clamps or springs, the corrosion negatively affects their performance, meaning over time, these parts will no longer provide a clamping force or a spring force within a required specification. In addition, corrosion can ultimately cause component parts to fail. Corrosion can further result in the shedding of particles. These particles can contaminate the work pieces undergoing processing, which adversely affect the processing yields.

To mitigate the aforementioned corrosion issues, work piece processing tool vendors, and/or their suppliers, will often coat component parts with either ceramic or aluminum. Due to challenges present within processing chambers, both materials have their disadvantages.

A thermal mismatch between the ceramic coating and the underlying component part may cause the two to expand and contract at different rates, particularly during the high temperature thermal cycles, typically experienced during work piece processing. The resulting mechanical stress may cause the ceramic to crack and/or fail. Second, the ceramic coatings are susceptible to scratching, flaking and/or accidental coating over particle contaminants, all of which may cause the ceramic coating to fail. Exposure of the underlying component part to the chemistry can cause corrosion that can eventually lead to a component part falling out of specification and/or failure.

Aluminum coatings are typically created using an electroplating process. During electroplating, a component part is typically clamped while held in an electroplating bath. Where clamped, a "rack" mark typically results because minimal to no plating occurs at these locations. As a result, bubbles trapped during the plating process can potentially later release inside a processing chamber during work piece processing. In addition, aluminum coatings grow an aluminum flouride layer when exposed to fluorine chemistries. Aluminum flouride is susceptible to particulation. Both the release of bubbles and particulation are problematic because they tend to contaminate the processing environment within the processing chamber during work piece processing.

SUMMARY

A work piece processing tool is disclosed including a processing chamber having at least one component part that is protected by a multi-layer coating that provides protection from damage caused by thermal cycling and exposure to the chemistries commonly used in processing chambers. In a non-exclusive embodiment, the multi-layer coating includes (a) an aluminum base layer formed on the at least one component part and (b) a ceramic coating formed on the underlying aluminum layer.

The multi-layer coating provides a number of advantages. A relatively thick base aluminum layer provides mechanical protection to the underlying component part. As a result, damage or failure due to mechanical stresses causes by a thermal mismatch between the component part and the aluminum layer during thermal cycling is largely mitigated or altogether eliminated. In addition, the relatively thick aluminum layer is less susceptible to failure due to scratching, flaking, and/or accidental coating over particle contaminants. The ceramic layer, on the other hand, is relatively inert with respect to many chemistries used in processing chambers, such as flourine. As a result, the underlying component part is largely protected from corrosion, preventing or mitigating parts from falling out of specification and/or failing. In addition, the ceramic layer is used to cover rack marks that may occur during the electroplating process of the underlying aluminum layer, which prevents the release of bubbles during work piece processing.

In non-exclusive embodiments, the base layer is aluminum having thickness of 25 microns, 250 microns, anywhere in the range of 25 to 250 microns, less than 25 microns, or more than 250 microns. In yet other embodiments, the ceramic coating is an amorphous aluminum oxide layer, an yttrium oxide layer or a combination of both. In yet other embodiments, the ceramic layer has a thickness of 1 micron or less or 10 microns or less.

In additional embodiments, the processing chamber includes one or more component parts, each protected with the multi-layer coating. The one or more component parts may include (a) any metal part or parts that are exposed to the aforementioned chemistries within the processing chamber and/or (b) are subject to some type of mechanical stress, such as flexing caused by thermal cycling, contact with or rubbing against other mechanical parts. Such component parts may include, but are not limited to, a wide assortment of sub-assemblies (e.g., shower head, a work piece heater, portions of the work piece holder, etc.) and/or a variety of mechanical parts, such as clamps, screws, bolts, springs, pins, clips and other mechanical fasteners.

In yet other embodiments, the processing chamber of the work piece processing tool may be assembled in a number of different ways. In a first embodiment, the component parts are first coated with the multi-layer coating by (a) electroplating the aluminum layer and (b) forming the ceramic layer using an Atomic Layer Deposition (ALD) process. Once coated, the component parts are used in the assembly of the processing chamber.

In an alternative embodiment that may be implemented with deposition tools, the component parts are (a) first coated with the aluminum layer using an electroplating process. Once coated with the aluminum layer, the component parts are used in the assembly of the processing chamber. Thereafter, the component parts are (b) coated with the ceramic layer in situ the processing chamber using a deposition process.

The work piece processing tool can be any type having a processing chamber used to process work pieces. In non-exclusive embodiments, the tool can be any type of deposition tool or a wet or dry etching tool. The work pieces may include semiconductor wafers, flat panel displays, or any other type work piece that requires processing.

BRIEF DESCRIPTION OF THE DRAWINGS

The present application, and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

Figure 1A:
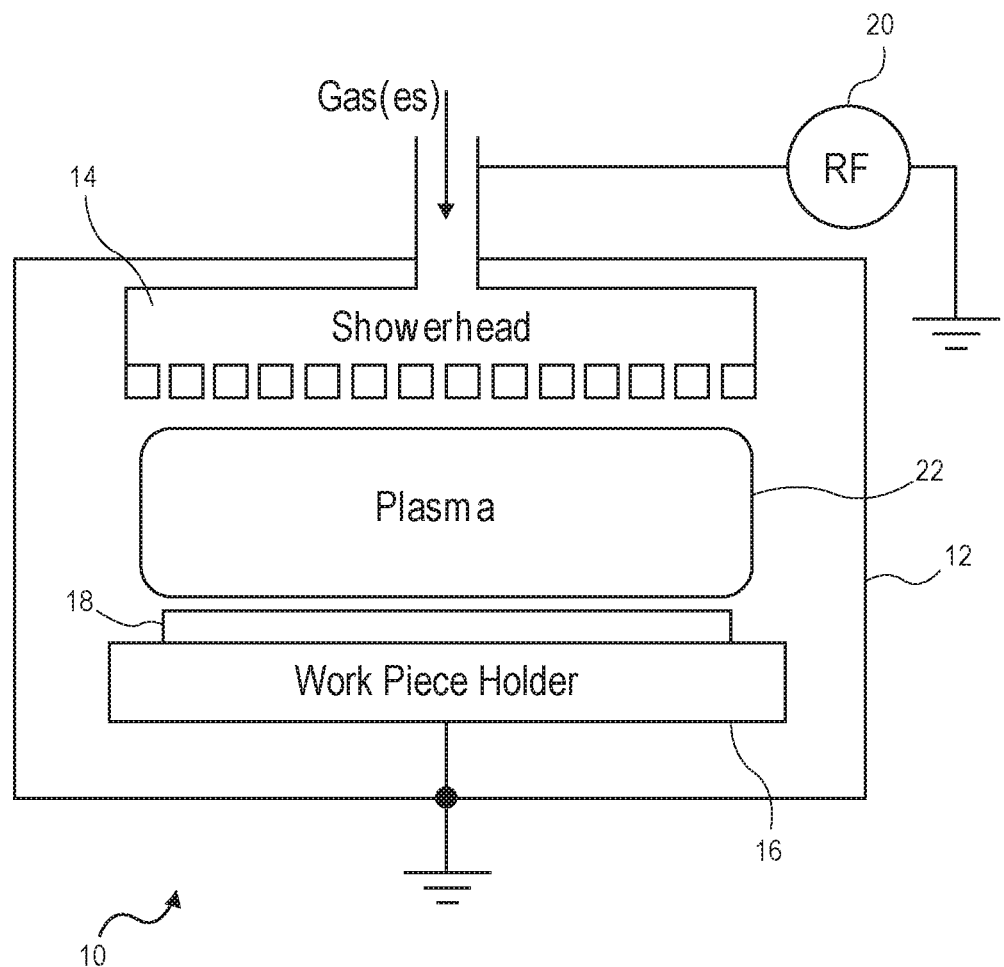
FIGS. 1A and 1B are diagrams of processing chambers of exemplary deposition and etching work tools used for processing work pieces in accordance with non-exclusive embodiments of the invention.
Figure 1B:
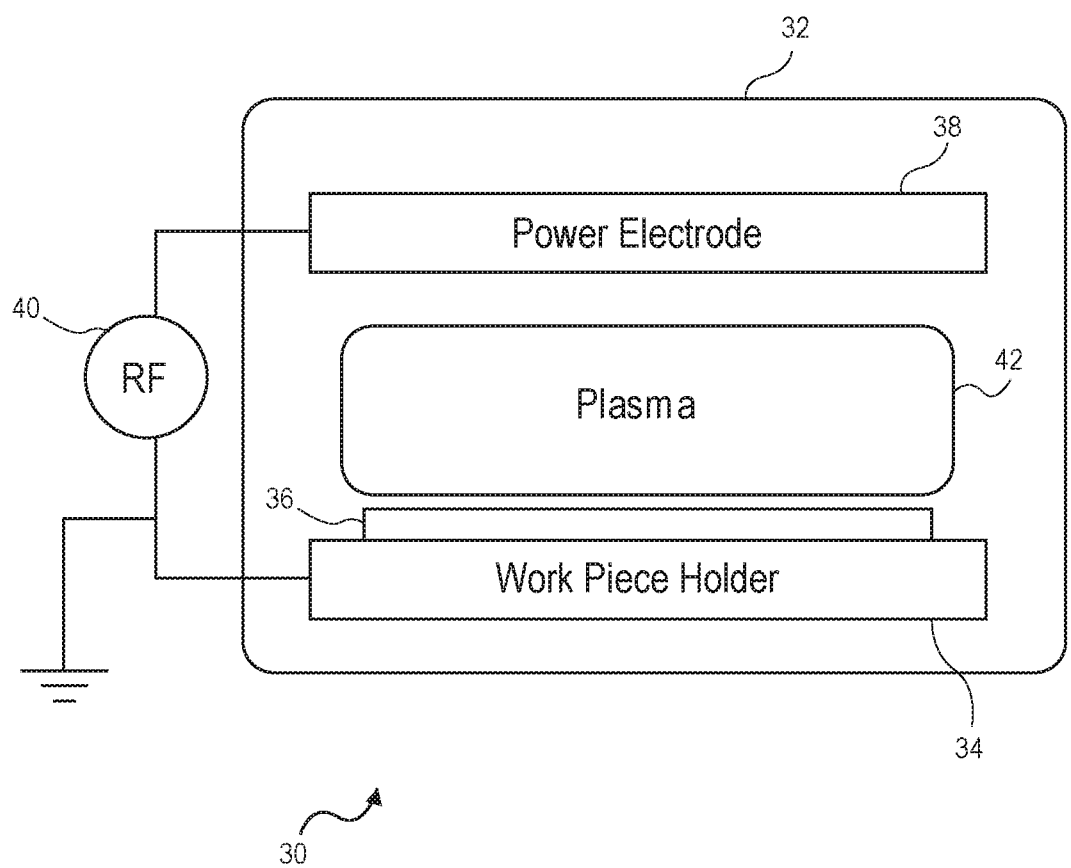

FIG. 1A and FIG. 1B are diagrams of processing chambers of exemplary deposition and etching work piece processing tools respectively.

Referring to FIG. 1A, a diagram of an exemplary Chemical Vapor Deposition (CVD) tool 10 is illustrated. The CVD tool 10 includes a processing chamber 12, a shower head 14, a work piece holder 16 for holding and positioning a work piece 18 to be processed, a Radio Frequency (RF) generator 20. In various embodiments, the CVD tool may be a Plasma Enhanced (PECVD), a Low Pressure (LPCVD), an Ultra High Vacuum (UHVCVD), an Atomic Layer Deposition (ALD), a Plasma-Enhanced Atomic Layer Deposition (PEALD) or any other type of CVD tool.

Reactant gas(es), such as such as silane ($SiH_4$), nitrous oxide ($N_2O$), ammonia ($NH_4$) and/or nitrogen ($N_2$), are supplied into the process chamber 12 through the shower head 14. Within the shower head 14, the gas(es) is/are distributed via one or more plenums (not illustrated), into the chamber 12 in the general area above the surface of the work piece 18 to be processed. An RF potential, generated by the RF generator 20, is then applied to an electrode (not illustrated) on the shower head 14. (An RF potential may also possibly be applied to the work piece holder 18 as well). The RF potential generates a plasma 22 within the processing chamber 12. Within the plasma 22, energized electrons ionize or dissociate (i.e., "crack") from the reactant gas(es), creating chemically reactive radicals. As these radicals react, they deposit and form a thin film on the work piece 18.

During work piece processing, the processing chamber 12 typically undergoes a thermal cycle. The range of the thermal cycle is determined by a number of factors, including the type of work piece, the particular chemistry used and the material to be deposited, the desired deposition rate, etc. Other factors that may also be considered are thermal budgets to prevent damage to films, the physical and chemical properties of films, and a general preference to use a lower temperature process whenever feasible.

For instance, the use of aluminum, rather than ceramic component parts within the processing chamber 12, is generally less costly. With the use of aluminum, however, temperatures beyond 450° C. tend to weaken or otherwise adversely affect the aluminum. Thus, to some degree, the use of aluminum components limits the thermal cycle upper range to approximately 450° C. Ceramic, on the other hand, can withstand elevated temperatures better than aluminum. As such, the upper limit of thermal cycles with ceramic can be higher. It should therefore be understood that the temperature range of a given thermal cycle may widely vary, for instance, anywhere from 20° to 450° C. or even 20° to 800° C., depending on various factors and other considerations mentioned above. These lower and upper temperature values are merely exemplary and should not be construed as limiting. Temperature values that are lower or higher may be used.

As previously noted, the material deposited onto work pieces 18 will also inadvertently deposit on various other surfaces within the processing chamber 12. To remove the build-up of these deposits, the tool 10 typically undergoes a periodic "dry cleaning" procedure, where a chlorine and/or flourine chemistry is introduced into the chamber 12 and RF power is applied generating a plasma. In response, the deposits are etched or otherwise removed from the surfaces within the chamber 12. Once the deposits are substantially removed, the tool 10 is then again used for processing work pieces 18 as discussed above.

Referring to FIG. 1B, a diagram of an exemplary plasma etching tool 30 is illustrated. The plasma etching tool 30 includes a processing chamber 32, a power electrode 38 and a RF power source 40 that is coupled to the power electrode 38. During operation, an etching chemistry, such as chlorine and/or flourine, is introduced into the processing chamber 32 and RF power is applied to the power electrode 38 by the RF source 40, creating a plasma 42. The plasma 42 etches away exposed material on the surface of the work piece 36 as is well known in the art.

The processing chamber 32 of the tool 30 also undergoes a thermal cycle. During work piece etching, the temperature inside the chamber 32 is typically elevated. The thermal cycle may widely vary and is also dependent on a variety of factors, such as the type of work piece, the type of material that is being etch, the materials of the component parts of the etch chamber etc. For instance, in a non-exclusive embodiment, the upper limit of the thermal cycle may be 450° C. or as high as 800° C. It should be understood, again, that these values are illustrative and should not be construed as limiting. Higher or lower temperatures may be used.

The processing chambers 10/30 of the deposition tool 10 and the etching tool 30 each include a wide variety of component parts. As used herein, the term "component parts" is intended to be broadly construed to mean (a) any metal part that is exposed to chemistries within a processing chamber 10/30 and/or (b) is subject to some type of mechanical stress, such as flexing caused by thermal cycling, contact and/or rubbing with another mechanical part. Such component parts may include, but are not limited to, a wide assortment of sub-assemblies (e.g., shower head, a work piece heater (not illustrated), portions of the work piece holder, etc.) and/or a variety of mechanical parts, such as clamps, screws, bolts, springs, pins, clips or other mechanical fasteners. In various embodiments, the component parts can be made from various metals and/or alloys, including for instance, aluminum, stainless steels, iron containing alloys, Inconel 718, Nonel, Nimonic 90, Waspaloy, A286 and others.

Figure 2A:
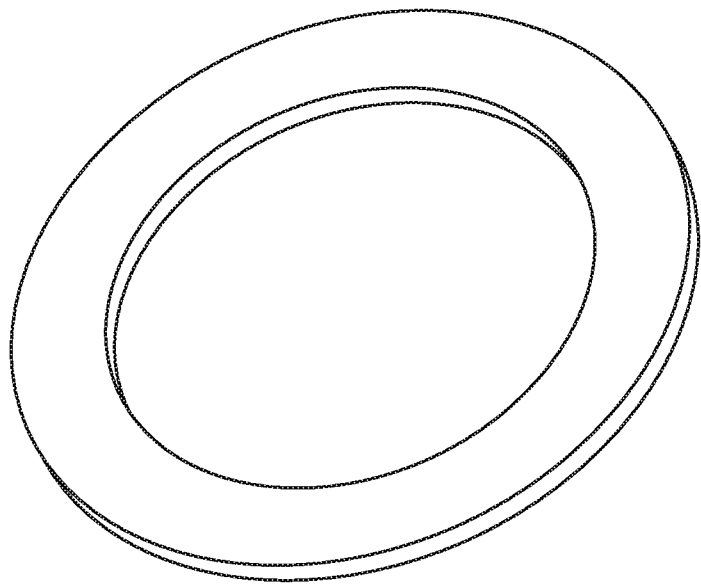
FIGS. 2A-2D are illustrations of various component parts that may be provided in a processing chamber in accordance with a non-exclusive embodiment of the invention.
Figure 2B:
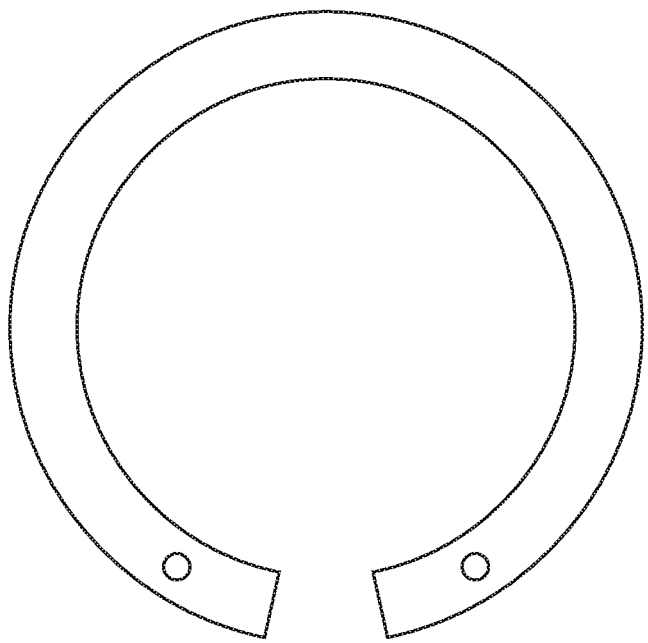
Figure 2C:
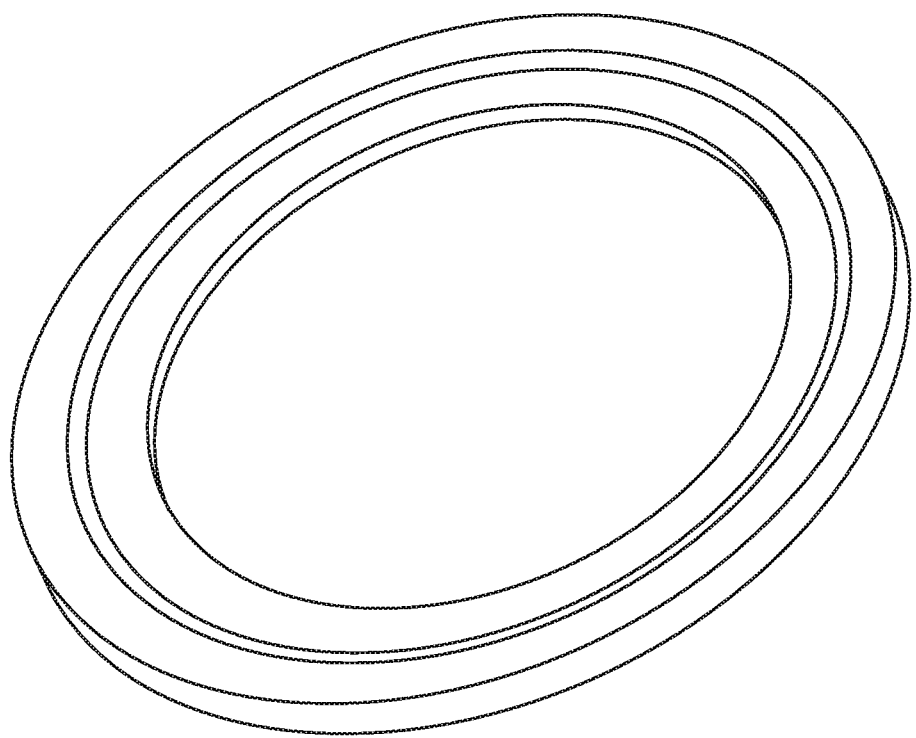
Figure 2D:
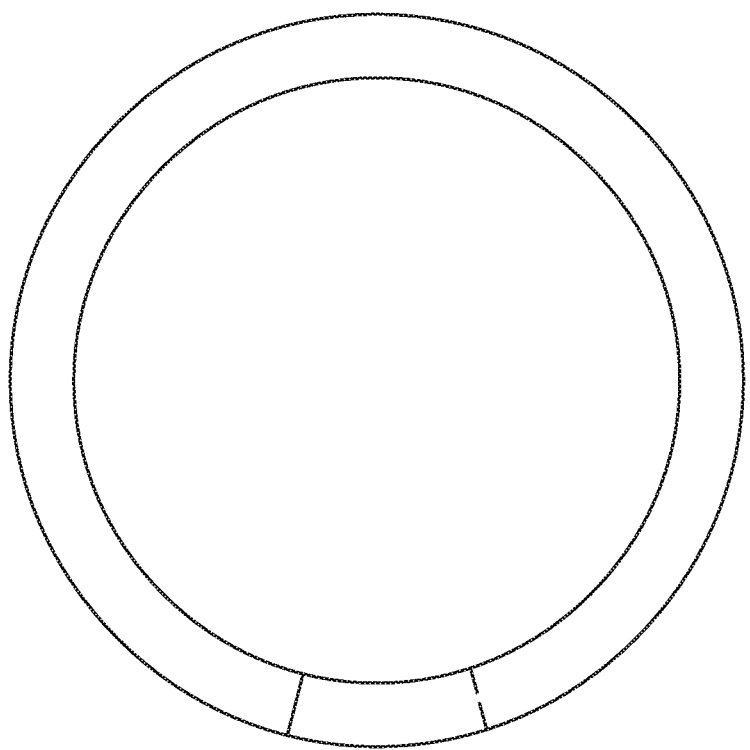
Figure 2D:
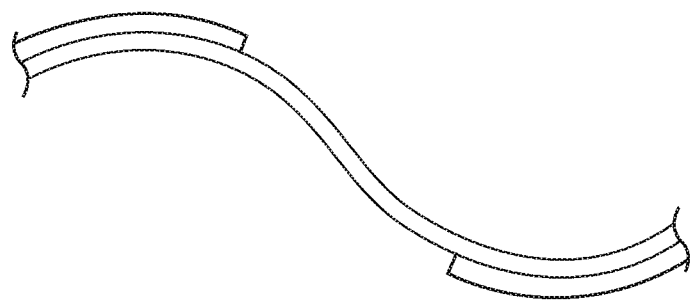

FIGS. 2A-2D are illustrations of various component parts that may be provided in the processing chamber of the work piece processing tool in accordance with a non-exclusive embodiment of the invention. In these examples, FIG. 2A illustrates a load distribution washer. FIG. 2B illustrates a retaining or "snap" ring. FIG. 2C illustrates a bearing-centered load distribution washer. Finally, FIG. 2D illustrate different views of a wave spring. These illustrations are merely exemplary and should not be construed as limiting in any regard. In actual embodiments, the number and type of component parts that may be covered with a multi-layer protective coating is far too numerous to practically illustrate herein.

To address the above-described corrosion, degradation and potential failure of component parts, the Applicant proposes the use of a multi-layer coating. In a non-exclusive embodiment, the multi-layer coating includes (a) an aluminum base layer formed on the least one component part and (b) a ceramic coating formed on the underlying aluminum layer.

In a non-exclusive embodiment, the base aluminum layer has a thickness of 25 microns and is formed by an electroplating process. The ceramic layer has a thickness of 1 micron or less and is formed using an Atomic Layer Deposition (ALD) process. Examples of ceramic coating may include, but are not limited to, an amorphous aluminum oxide ceramic layer ($Al_2O_3$), a yttrium oxide layer ($Y_2O_3$), or a laminate of both. It should be understood that the materials and dimensions of the multi-layered coating as described with regard to this embodiment are exemplary and are not to be construed as limiting. Multi-layer coatings of a wide variety of different materials and thicknesses, selected for their mechanical properties and/or inertness with respect to different chemistries, may be used. For example, the aluminum base layer may have thicknesses of less than 25 microns, ranging from 25 to 250 microns, or more than 250 microns. Due to the slow deposition rates of ALD and the stresses that exist in the deposited film, the thickness of the ceramic layer typically used is less than 1 micron. However, again, this should not be construed as limiting. Thicker layers, such as 10 microns or more, can be used.

The multi-layer protective coating provides a number of advantages. The relatively thick base aluminum layer provides mechanical protection to the underlying component part. As a result, failure due to mechanical stresses causes by a thermal mismatch between the component part and the aluminum layer during thermal cycling is largely mitigated or altogether eliminated. In addition, the relatively thick aluminum layer is less susceptible to failure due to scratching, flaking and/or accidental coating over particle contaminants. The ceramic layer, on the other hand, is inert to and provides protection against various chemistries, such as flourine. The ceramic layer protects the underlying component part from corrosion and prevents particulation of the underlying aluminum. In addition, the ceramic layer covers rack marks that may occur during the electroplating process of the aluminum layer, preventing the release of trapped bubbles.

Figure 3A:
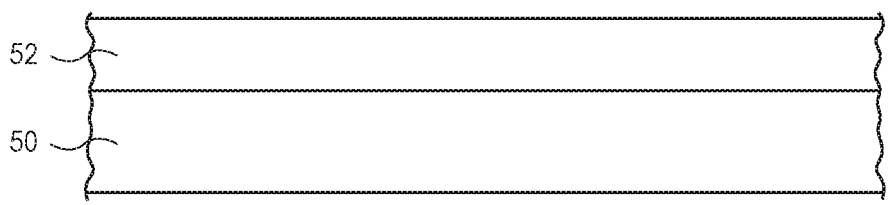
FIGS. 3A-3B are cross-section diagrams of various multi-layer coatings applied to component part(s) in accordance with a non-exclusive embodiment of the invention.
Figure 3B:
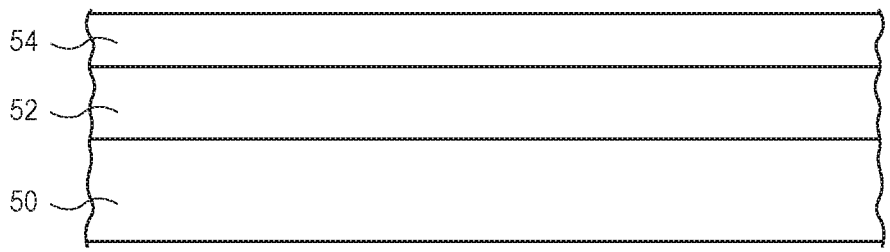

FIGS. 3A-3C are cross-section diagrams of various multi-layer coatings applied to an exemplary component part 50 in accordance with non-exclusive embodiment of the invention.

In FIG. 3A, an aluminum layer 52 is formed on the surface of the component part 50. In various embodiments, the aluminum layer 52 is formed by an electroplating process and has a thickness of at least 25 microns. In alternative embodiments, the aluminum layer may have a thickness ranging from 25 to 250 microns, less than 25 microns, or more than 250 microns. In addition, the purity level of the aluminum may also vary. In some embodiments, high purity aluminum may be used, while in other embodiments, lower purity aluminum may be used.

In FIG. 3B, ceramic coating layer 54 is formed on the underlying aluminum layer 52. In various embodiments, ceramic coating layer 54 has a thickness of 1 micron or less and is formed using an Atomic Layer Deposition (ALD) process. Examples of the ceramic coating layer 54 include, but are not limited to, an amorphous aluminum oxide ceramic layer, a yttrium oxide layer, or a laminate of both. In alternative embodiments, the ceramic coating layer 54 may be formed using any deposition process and may include other ceramic materials besides those listed herein. In addition, the thickness may vary, for example, from 1 micron or less, 10 microns or less, or more than 10 microns.

Figure 4A:
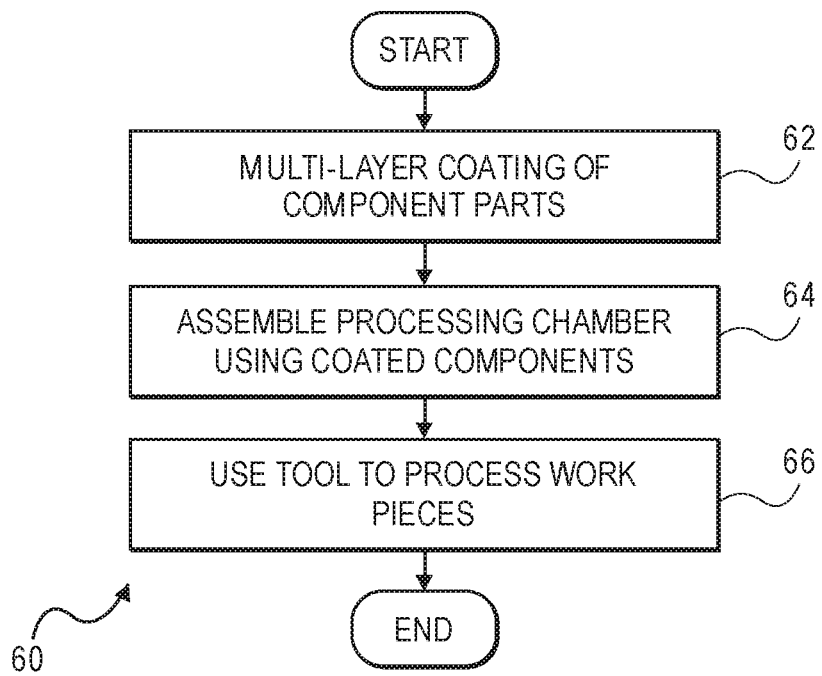
FIGS. 4A and 4B are flow diagrams illustrating steps for assembling a work piece processing tool in accordance with non-exclusive embodiments of the invention.
Figure 4B:
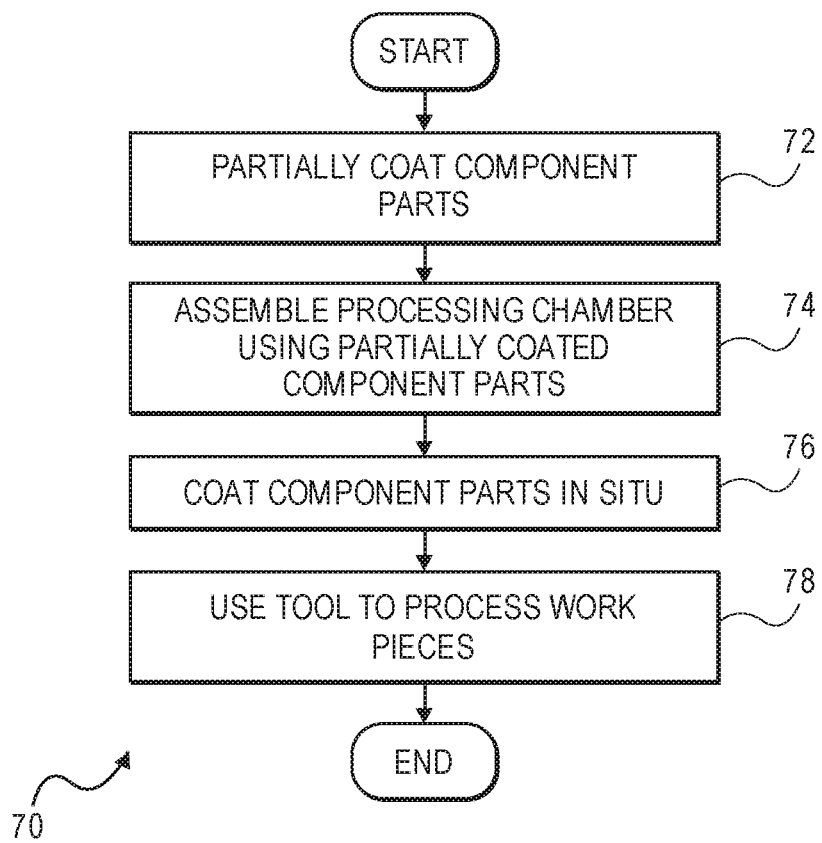

FIGS. 4A and 4B are flow diagrams illustrating steps for assembling a work piece processing tool in accordance with non-exclusive embodiments of the invention.

Referring to FIG. 4A, a flow diagram 60 is illustrated where the multi-layer coating of component parts occurs prior to assembly of a processing chamber of a tool.

The initial step 62 involves applying a multi-layer coating of one or more component parts using any of the embodiments described above. In other words, the one or more component parts are coated with at least (a) an aluminum base layer 52 formed on at least one component part 50 and (b) a ceramic coating layer 54 formed on the underlying aluminum layer. Again, the term component part as used herein is intended to be broadly construed and include, but is not limited to, any of the above-listed component parts that may subject to mechanical stresses and/or exposed to chemistries within a processing chamber.

In step 64, the processing chamber of the tool is assembled using, at least in part, the component parts with the multi-layer coating as well as other non-coated parts and/or sub-assemblies. Thereafter, the processing chamber and tool are tested and is made operable as is well known in the art.

In step 66, the tool is used to process work pieces, such as semiconductor wafers, flat panel displays, etc. In various embodiments, the tool may be a deposition tool used for depositing thin films onto the work pieces or an etching tool used to selectively remove material from the work pieces.

Referring to FIG. 4B, a flow diagram 70 is illustrated where the multi-layer coating of component parts occurs partially prior to assembly of a processing chamber of a tool and partially in situ once the processing tool has been assembled and is operational. With this embodiment, only deposition tools may be used.

The initial step 72 involves partial coating, one or more component parts, with (a) an aluminum base layer 52 using any of the above-described embodiments.

In step 74, the processing chamber of the tool is assembled using the one or more component parts coated with just the aluminum base layer 52. Thereafter, the tool is tested and made operational as is well known in the art.

In step 76, the (b) ceramic coating layer 54 is formed in situ the processing chamber of the tool. For example, with an Atomic Layer Deposition (ALD) tool, the ceramic layer 54 is deposited onto the aluminum base layer 52 using any of the above-described embodiments. With this embodiment, it should be understood that the other exposed surfaces within the processing chamber are likely to be coated with the ceramic material as well, unless steps are taken to mask or otherwise prevent the deposit from occurring on such surfaces.

Finally, in step 78, the tool is used for processing work pieces.

One noted advantage of the process as illustrated in FIG. 4B is the ability to recoat the ceramic layer 54 in situ the processing chamber from time to time. As the processing tool is used to process work pieces, it is possible that the ceramic layer 54 may degrade with repeated exposure to various chemistries. With the ability to form the ceramic coating 54 in situ, the one or more component parts can be periodically re-coated as part of a routine maintenance procedure without having to disassemble the processing chamber and/or tool.

It should be understood that while the embodiments described herein were largely related to deposition and etching tools, this should be by no means construed as limiting. On the contrary, the subject matter as described herein may be used with any type of work piece processing tool, regardless of the type of work piece or how the work piece is processed.

It should be understood that the embodiments provided herein are merely exemplary and should not be construed as limiting in any regard. Although only a few embodiments have been described in detail, it should be appreciated that the present application may be implemented in many other forms without departing from the spirit or scope of the disclosure provided herein. Therefore, the present embodiments should be considered illustrative and not restrictive and is not to be limited to the details given herein, but may be modified within the scope and equivalents of the appended claims.

What is claimed is:

1. A processing tool comprising a processing chamber for processing a work piece, the processing chamber including at least one component part subject to mechanical stress having a multi-layer coating including (a) an aluminum mechanical protection layer formed on the at least one component part, the aluminum mechanical protection layer comprising a thickness of 25 microns or greater, and (b) a deposited ceramic coating formed on the aluminum mechanical protection layer, wherein the deposited ceramic coating has a thickness of 10 microns or less, wherein the deposited the ceramic coating comprises yttrium oxide and is protective against fluorine, and wherein the at least one component part is made from an iron-containing alloy.

2. The processing tool of claim 1, wherein the deposited ceramic coating is an amorphous aluminum oxide ceramic layer.

3. The processing tool of claim 1, wherein the deposited ceramic coating is a laminate of amorphous aluminum oxide ceramic and yttrium oxide.

4. The processing tool of claim 1, wherein the deposited ceramic coating has a thickness of 0.1 to 1 micron.

5. The processing tool of claim 1, wherein the aluminum mechanical protection layer has a thickness of 25 to 250 microns.

6. The processing tool of claim 1, wherein the deposited ceramic coating has a thickness of 0.1 to 1 micron.

7. The processing tool of claim 1, wherein the aluminum mechanical protection layer comprises a rack mark, and wherein the deposited ceramic coating covers the rack mark.

8. The processing tool of claim 1, wherein the at least one component part is a spring, a washer, or a retaining ring.

9. The processing tool of claim 1, wherein the processing tool is either a deposition tool or an etching tool.

10. A method of forming at least one component part of a processing chamber subject to mechanical stress, comprising:

electroplating the at least one component part to form an aluminum mechanical protection layer formed on the at least one component part, the aluminum mechanical protection layer comprising a thickness of 25 microns or greater, wherein the at least one component part is made of an iron-containing alloy; and depositing a deposited ceramic coating formed on the aluminum mechanical protection layer after the electroplating using vapor phase deposition, wherein the deposited ceramic coating has a thickness of 0.25 micron to 10 microns and is protective against fluorine, and wherein the electroplating and depositing is performed prior to assembly of the processing chamber including the at least one component part.

11. The method of claim 10, wherein the aluminum mechanical protection layer has a thickness of 25 to 250 microns.

12. The method of claim 10, wherein the deposited ceramic coating comprises one of the following:
   (c) an amorphous aluminum oxide ceramic layer;
   (d) a yttrium oxide layer; or
   (e) a laminate of amorphous aluminum oxide ceramic and yttrium oxide.

13. The method of claim 10, wherein the deposited ceramic coating comprises a thickness of 1 micron or less.

14. The method of claim 10, wherein the at least one component part is a spring, a washer, or a retaining ring.

15. The method of claim 10, wherein the processing chamber is incorporated into either a deposition tool or an etching tool.

16. The processing tool of claim 8, wherein the at least one component part is the washer, and wherein the washer is a bearing-centered load distribution washer.

17. The method of claim 14, wherein the at least one component part is the washer, and wherein the washer is a bearing-centered load distribution washer.

18. A processing tool comprising a processing chamber for processing a work piece, the processing chamber including at least one component part subject to mechanical stress having a multi-layer coating including (a) an aluminum mechanical protection layer formed on the at least one component part, the aluminum mechanical protection layer comprising a thickness of 25 microns or greater, and (b) a deposited ceramic coating formed on the aluminum mechanical protection layer, wherein the deposited ceramic coating has a thickness of 0.25 micron to 10 microns and is protective against fluorine, and wherein the at least one component part is made from an iron-containing alloy.

19. The processing tool of claim 18, wherein the deposited ceramic coating comprises a deposited amorphous aluminum oxide layer.

20. The processing tool of claim 18, wherein the deposited ceramic coating comprises a deposited yttrium oxide layer.

* * * * *